United States Patent
Wang et al.

(10) Patent No.: US 8,273,629 B2
(45) Date of Patent: Sep. 25, 2012

(54) THROUGH-GATE IMPLANT FOR BODY DOPANT

(75) Inventors: Geng Wang, Stormville, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 12/701,972

(22) Filed: Feb. 8, 2010

(65) Prior Publication Data

US 2010/0237417 A1 Sep. 23, 2010

Related U.S. Application Data

(60) Provisional application No. 61/161,446, filed on Mar. 19, 2009.

(51) Int. Cl.
*H01L 21/336* (2006.01)

(52) U.S. Cl. ........ 438/289; 438/163; 438/170; 438/257; 438/259; 438/283; 257/347; 257/351; 257/354; 257/365; 257/E21.704

(58) Field of Classification Search .......... None
See application file for complete search history.

(56) References Cited

U.S. PATENT DOCUMENTS

| | | | |
|---|---|---|---|
| 6,383,904 B1 * | 5/2002 | Yu | 438/589 |
| 6,503,805 B2 | 1/2003 | Wang et al. | |
| 7,092,233 B2 | 8/2006 | DeBoer et al. | |
| 7,262,463 B2 | 8/2007 | Hoffman | |
| 7,274,076 B2 | 9/2007 | Williford | |

* cited by examiner

*Primary Examiner* — Kyoung Lee
(74) *Attorney, Agent, or Firm* — Scully, Scott, Murphy & Presser, P.C.; Joseph P. Abate, Esq.

(57) ABSTRACT

The present invention, provides a semiconductor device including a substrate including a semiconductor layer overlying an insulating layer, wherein a back gate structure is present underlying the insulating layer and a front gate structure on the semiconductor layer; a channel dopant region underlying the front gate structure of the substrate, wherein the channel dopant region has a first concentration present at an interface of the semiconductor layer and the insulating layer and at least a second concentration present at the interface of the front gate structure and the semiconductor layer, wherein the first concentration is greater than the second concentration; and a source region and drain region present in the semiconductor layer of the substrate.

9 Claims, 4 Drawing Sheets

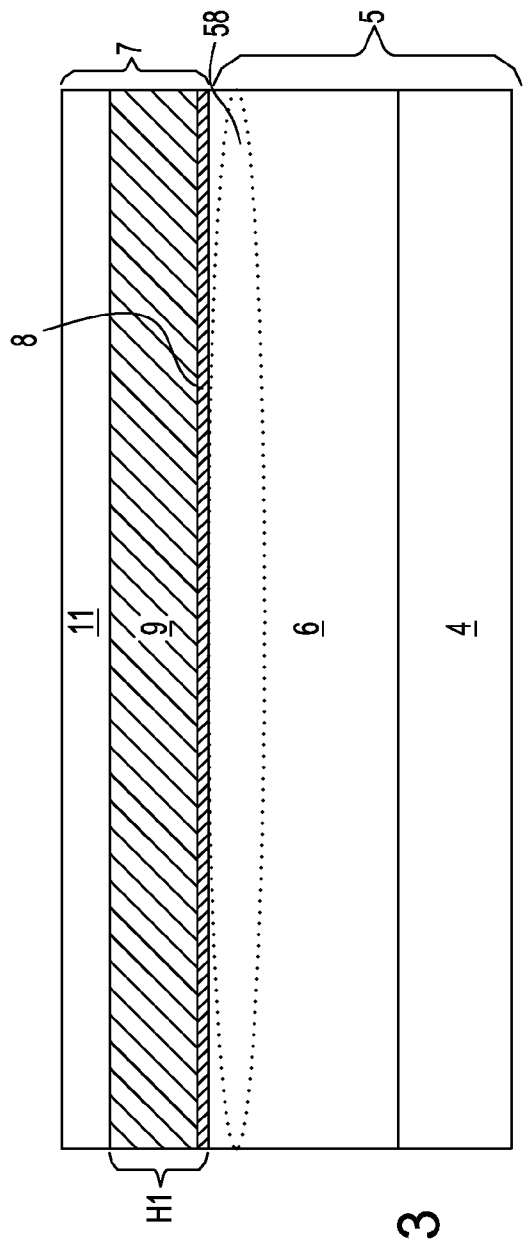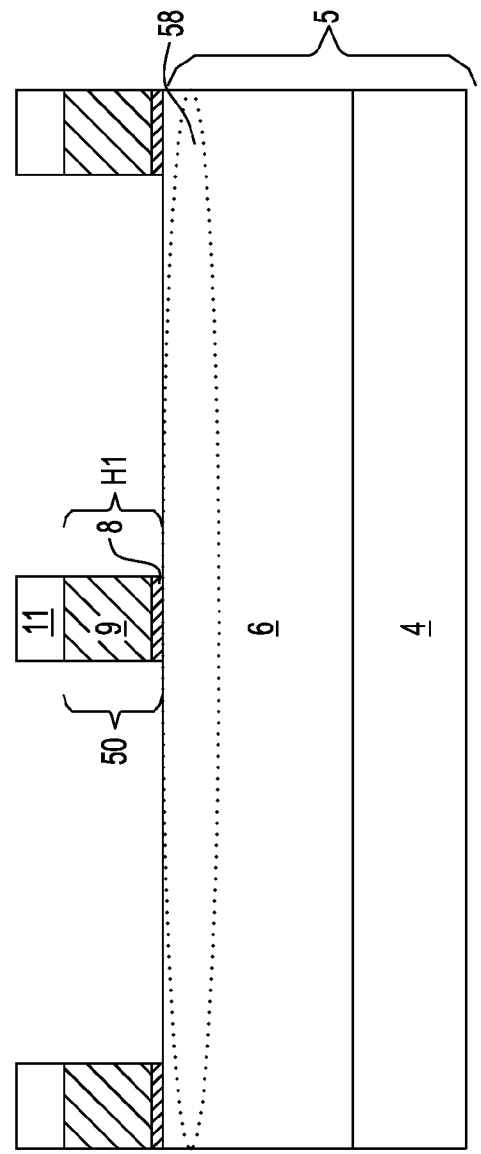

THROUGH-GATE IMPLANT FOR BODY DOPANT

This non-provisional application claims the benefit of the provisional application filed with the U.S. Patent and Trademark Office as Ser. No. 61/161,446 entitled "Through-Gate Implant for Body Dopant" filed Mar. 19, 2009.

FIELD OF THE INVENTION

The present invention, relates to semiconductor devices and methods for forming semiconductor devices. More particularly, an implant process is provided for doping the channel of the device through the gate structure.

BACKGROUND OF THE INVENTION

The ever increasing scale of integration of integrated circuits has resulted in increasingly smaller device dimensions and has further resulted in device components being positioned closer and closer together in a semiconductor substrate. The close proximity of device structures results in problems in isolating device structures. For example, the demand for increasingly higher scales of integration of integrated circuits has resulted in field effect transistors in which the source regions and drain regions of the transistors are positioned closer and closer together. In this particular circumstance, the close proximity of the source region and the drain region can result in electrical conduction between the source and drain that is not responsive to the formation of a conductive channel in the substrate as a result of activation of the gate of the transistor.

Particularly, if the device is of the partially depleted silicon on insulator type (PD-SOI), the buried insulator or other device components that are in close proximity to the source region and drain region can function as an undesirable back gate of the device and facilitate leakage. Once the back channel leakage exceeds a limit under which the field effect transistor is designed to work, the transistor is no longer operating in a desired manner, which can negatively affect the overall operation of the integrated circuit and can possibly result in damage to the circuit.

SUMMARY OF THE INVENTION

The present invention provides a method of doping a body of a semiconductor device. Moreover, the present invention provides a method of doping a body of a semiconductor device having a substrate composed of a semiconductor layer atop an insulating layer.

Broadly, the method of forming a semiconductor device may include:
providing a substrate including a semiconductor layer overlying an insulating layer, wherein a back gate structure is present underlying the insulating layer;
forming a front gate structure overlying the semiconductor layer of the substrate; and
implanting a first dopant through the front gate structure into the substrate, wherein the first dopant implanted into a portion of the substrate underlying the front gate structure is present at a depth approximately equal to an interface between the semiconductor layer and the insulating layer and the first dopant implanted into a portion of the substrate adjacent to the portion of the substrate underlying the front gate structure is present at a depth extending into the insulating layer.

In another aspect, the present invention may provide a semiconductor device, wherein the semiconducting device may be formed from the above-described method. Broadly, the semiconductor device may include:
a substrate including a semiconductor layer overlying an insulating layer;
a back gate structure present underlying the insulating layer of the substrate;
a front gate structure on the semiconductor layer of the substrate;
a channel dopant region underlying the front gate structure comprising a first concentration present at an interface of the semiconductor layer and the insulating layer and at least a second concentration present at the interface of the front gate structure and the semiconductor layer, wherein the first concentration is greater than the second concentration; and
a source region and drain region present in the semiconductor layer of the substrate.

In another aspect, the present invention provides a semiconductor device that includes:
a substrate including a first device region and a second device region, wherein the substrate comprises a semiconductor layer overlying an insulating layer;
a back gate structure present underlying the insulating layer of the substrate;
a first semiconductor device present in the first device region comprising a first channel dopant region underlying a first front gate structure, wherein the first channel dopant region has a first concentration present at an interface of the semiconductor layer and the insulating layer and at least a second concentration present at the interface of the first front gate structure and the semiconductor layer, wherein the first concentration is greater than the second concentration;
a second semiconductor device present in the second device region comprising a second channel dopant region underlying a second front gate structure, wherein the second channel dopant region has a first concentration present at an interface of the semiconductor layer and the insulating layer and at least a second concentration present at the interface of the second front gate structure and the semiconductor layer, wherein the first concentration is greater than the second concentration;
a common source and drain region to the first semiconductor device and the second semiconductor device having a conductivity type that is opposite the first channel dopant region and the second channel dopant region; and
a dopant region of same conductivity type as the first channel dopant region and the second channel dopant region present in the insulating layer underlying the common source and drain region.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 3 is a side cross-sectional view of an initial structure including a gate layer stack present atop a substrate composed of a semiconductor layer atop an insulating layer, in accordance with the present invention.

FIG. 4 is a side cross-sectional view depicting forming a gate structure overlying the semiconductor layer of the substrate, in accordance with the present invention.

DETAILED DESCRIPTION OF THE INVENTION

Figure 1:
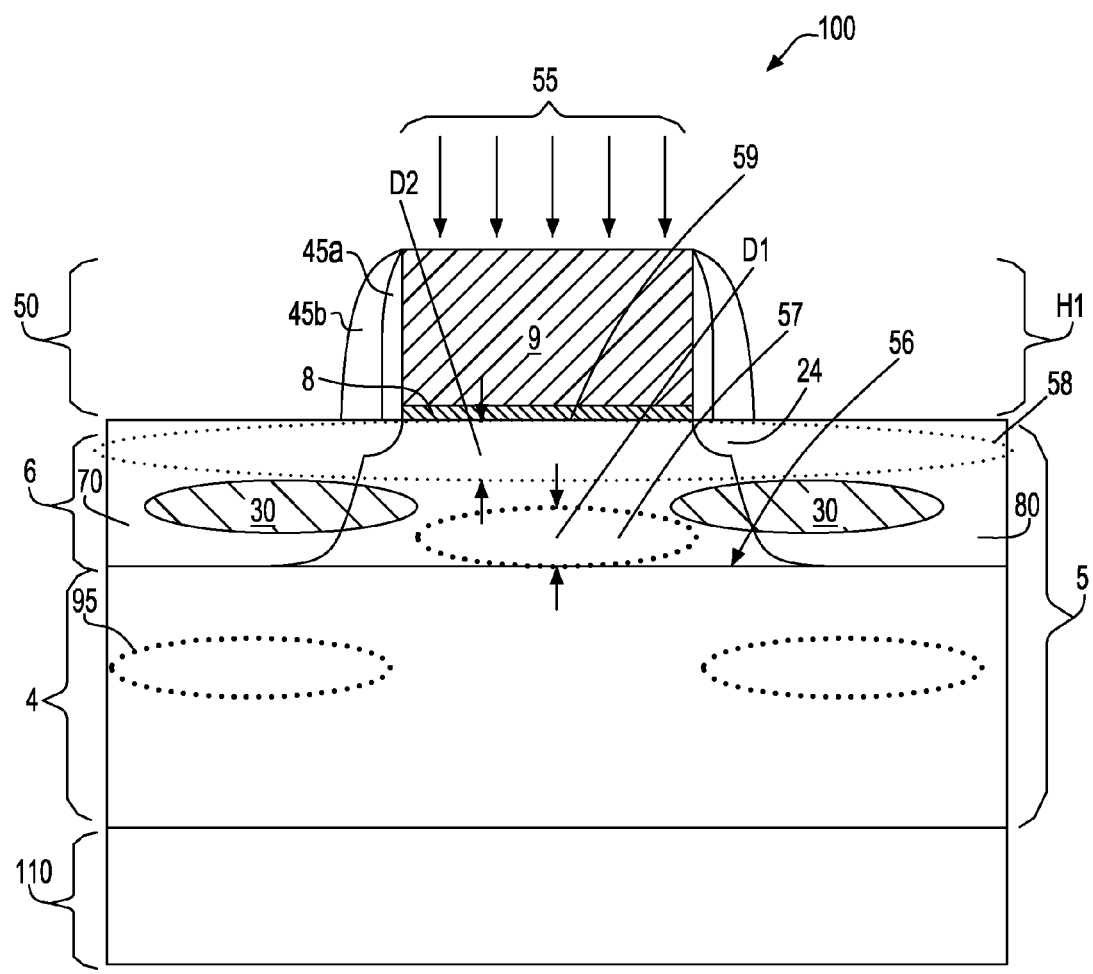
FIG. 1 is a side cross-sectional view depicting the doping gradient of a semiconductor device, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to a semiconductor device having a channel dopant region present at the interface of a semiconductor layer and an insulating layer of a substrate and a method of forming the aforementioned device. When describing the following structures and methods, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor.

As used herein, the term "conductivity type" denotes a dopant region being p-type or n-type.

As used herein, "p-type" refers to the addition of impurities to an intrinsic semiconductor that create deficiencies of valence electrons, such as boron, aluminum, gallium or indium to an intrinsic Si-containing substrate.

As used herein, "n-type" refers to the addition of impurities that contribute free electrons to an intrinsic semiconductor, such as antimony, arsenic or phosphorous to a Si-containing substrate.

A "gate structure" means a structure used to control output current (i.e. flow of carriers in the channel) of a semiconductor device through electrical or magnetic fields.

As used herein, the term "channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the semiconductor device through the drain.

As used herein, the term "source" is a doped region in the semiconductor device, from which the majority carriers are flowing into the channel.

As used herein, the terms "insulating" and "dielectric" denote a material having a room temperature conductivity of less than about $10^{-10}(\Omega\text{-m})^{-1}$.

The terms "overlying", "atop", "positioned on" or "positioned atop" mean that a first element, such as a first structure, e.g. a first layer, is present on a second element, such as a second structure, e.g. a second layer, wherein intervening elements, such as an interface structure, e.g. interface layer, may be present between the first element and the second element.

The term "direct physical contact" means that a first element, such as a first structure, and a second element, such as a second structure, are connected without any intermediary conducting, insulating or semiconductor layers at the interface of the two materials.

FIG. 1 depicts a semiconductor device 100 including a channel dopant region 55 that is present at the interface 56 of a semiconductor layer 6 and an insulating layer 4 of a substrate 5. The semiconductor device 100 may include a substrate 5 including a semiconductor layer 6 overlying an insulating layer 4 and a front gate structure 50 on the semiconductor layer 6 of the substrate 5. A back gate structure 110 is present on the side of the insulating layer 4 that is opposite the side of the insulating layer 4 that forms the interface 56 with the semiconductor layer 6.

The channel dopant region 55 may be underlying the front gate structure 50 of the substrate 5, wherein the channel dopant region 55 has a first concentration 57 present at an interface 56 of semiconductor layer 6 and the insulating layer 4 and at least a second concentration 58 present at the interface 59 of the front gate structure 50 and the semiconductor layer 6, wherein the first concentration 57 is greater than the second concentration 58. The semiconductor device 100 further includes a source region 70 and a drain region 80 present in the semiconductor layer 6 of the substrate 5.

The channel dopant region 55 may include a first conductivity type dopant and the source region 70 and the drain region 80 may include a second conductivity type dopant. The first conductivity type dopant may include an n-type dopant and the second conductivity dopant includes a p-type dopant. The first conductivity type dopant may also be a p-type dopant and the second conductivity dopant may also be an n-type dopant.

The first concentration 57 of the channel dopant region 55 may range from about $1\times10^{17}$ cm$^{-3}$ to about $2\times10^{19}$ cm$^{-3}$, wherein the dopant is composed of boron or indium for p-type dopant regions, and wherein the dopant is composed of arsenic or phosphorus for n-type dopant regions. In another embodiment, the first concentration 57 of the channel dopant region 55 ranges from about $2\times10^{17}$ cm$^{-3}$ to about $1\times10^{19}$ cm$^{-3}$, wherein the dopant is composed of boron or indium for p-type dopant regions, and wherein the dopant is composed of arsenic or phosphorus for n-type dopant regions. In an even further embodiment, the first concentration 57 of the channel dopant region 55 ranges from about $5\times10^{17}$ cm$^{-3}$ to about $5\times10^{18}$ cm$^{-3}$, wherein the dopant is composed of boron for p-type and arsenic or phosphorus for n-type.

The portion of the channel dopant region 55 having the first concentration 57 extends from the interface 56 of the semiconductor layer 6 and the insulating layer 4 by a dimension $D_1$ extending towards the front gate structure 50 and having a value ranging from about 20 nm to about 200 nm. In another embodiment, the portion of the channel dopant region 55 having the first concentration 57 extends from the interface 56 of the semiconductor layer 6 and the insulating layer 4 by a dimension $D_1$ extending towards the front gate structure 50 and having a value ranging from about 40 nm to about 150 nm. In another example, the portion of the channel dopant region 55 having the first concentration 57 extends from the interface 56 of the semiconductor layer 6 and the insulating layer 4 by a dimension $D_1$ extending towards the front gate structure 50 and having a value ranging from about 50 nm to about 100 nm.

The second concentration 58 of the channel dopant region 55 may range from about $5 \times 10^{16}$ cm$^{-3}$ to about $1 \times 10^{19}$ cm$^{-3}$, wherein the dopant is composed of boron or indium for p-type dopant regions, and wherein the dopant is composed of arsenic or phosphorus for n-type dopant regions. More typically, the second concentration 58 of the channel dopant region 55 ranges from about $1 \times 10^{17}$ cm$^{-3}$ to about $5 \times 10^{18}$ cm$^{-3}$, wherein the dopant is composed of boron or indium for p-type dopant regions, and wherein the dopant is composed of arsenic or phosphorus for n-type dopant regions. In another example, the second concentration 58 of the channel dopant region 55 ranges from about $2 \times 10^{17}$ cm$^{-3}$ to about $3 \times 10^{18}$ cm$^{-3}$, wherein the dopant is composed of boron for p-type dopant regions and wherein the dopant is composed of arsenic for n-type dopant regions.

The portion of the channel dopant region 55 having the second concentration 58 extends from the interface 59 of the semiconductor layer 6 and the front gate structure 50 in a dimension $D_2$ extending towards the insulating layer 4 of the substrate 5 by a value ranging from about 0 nm to about 150 nm. More typically, the portion of the channel dopant region 55 having the second concentration 58 extends from the interface 59 of the semiconductor layer 6 and the front gate structure 50 in a dimension $D_2$ extending towards the insulating layer 4 of the substrate 5 by a value of less than about 80 nm. Even more typically, the portion of the channel dopant region 55 having the second concentration 58 extends from the interface 59 of the semiconductor layer 6 and the front gate structure 50 in a dimension $D_2$ extending towards the insulating layer 4 of the substrate 5 by a value of less than 50 nm.

The portion of the channel doping region 55 in the semiconductor layer 6 that is separating the first dopant concentration 57 from the second dopant concentration 58 typically has an increasing dopant concentration. For example, the dopant concentration increases from the portion of the channel dopant region 55 having the first dopant concentration 57 to the portion of the channel dopant region 55 having the second dopant concentration 58. The increasing dopant concentration may be referred to as a graded doping concentration. In one illustrative example, a graded doping profile is provided in which the doping concentration at the interface 59 of the front gate structure 50 and the semiconductor layer 6 is approximately $2 \times 10^{17}$ doping atoms per cm$^3$ at the surface, and then increases to a peak value of approximately $4 \times 10^{17}$ doping atoms per cm$^3$ at the interface 56 of the semiconductor layer 6 and the insulating layer 4 of the substrate 5.

The semiconducting device 100 further includes a dopant region 95 in the insulating layer 4 underlying the source region 70 and the drain region 80, wherein the dopant region 95 is of a same conductivity type as the channel dopant region 55. For example, the dopant region 95 in the insulating layer 4 may have a concentration that ranges from about $1 \times 10^{17}$ cm$^{-3}$ to about $2 \times 10^{19}$ cm$^{-3}$, wherein the dopant is composed of boron or indium for p-type dopant regions, and wherein the dopant is composed of arsenic or phosphorus for n-type dopant regions. In another example, the dopant region 95 in the insulating layer 4 ranges from about $2 \times 10^{17}$ cm$^{-3}$ to about $1 \times 10^{19}$ cm$^{-3}$, wherein the dopant is composed of boron or indium for p-type dopant regions, and wherein the dopant is composed of arsenic or phosphorus for n-type dopant regions. In another example, the dopant region 95 in the insulating layer 4 ranges from about $5 \times 10^{17}$ cm$^{-3}$ to about $5 \times 10^{18}$ cm$^{-3}$, wherein the dopant is composed of boron for p-type and arsenic or phosphorus for n-type. The semiconducting device 100 may also include halo dopant regions 30. The halo dopant regions 30 may be composed of a conductivity type dopant that is opposite the conductivity type of the source region 70 and the drain region 80.

Figure 2:
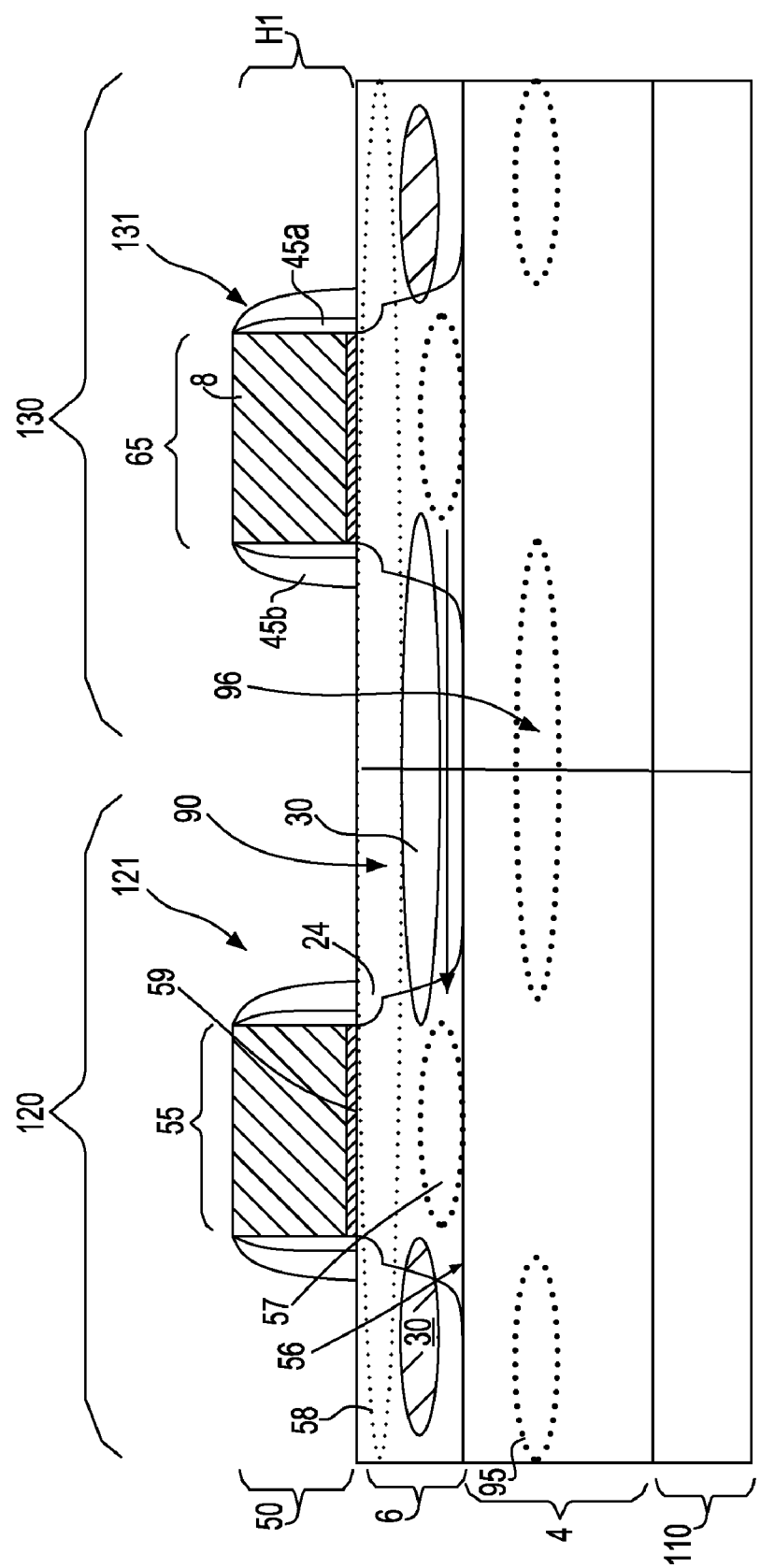
FIG. 2 is a side cross-sectional view depicting the doping gradient of a device configuration, in which two devices of the same conductivity type are disposed next to one another sharing a dopant region, i.e., common source and drain region, in accordance with present invention.

FIG. 2 depicts the above-described semiconductor device 100 integrated into an arrangement in which a first semiconductor device 121 and a second semiconductor device 131 of the same conductivity type are positioned next to one another and share a common source and drain region 90, i.e., the first semiconductor device 121 and the second semiconductor device 131 share a single source or drain region. In one embodiment, the common source and drain region 90 isolates the first semiconductor device 121 from the second semiconductor device 131. More specifically, the common source and drain region 90 is composed of an opposite conductivity type than the channel region of the first semiconductor device 121 and the channel region of the second semiconductor device 131, and therefore electrically isolates the first semiconductor device 121 from the second semiconductor device 131. For example, when the first semiconductor device 121 and the second semiconductor device 131 have channel regions of a p-type conductivity, the common source and drain region 90 is of an n-type conductivity, and vice versa.

Similar to the device described-above with reference to FIG. 1, the first semiconductor device 121 and the second semiconductor device 131 (nFET or pFET devices) that are depicted in FIG. 2 each include a substrate 5 having a semiconductor layer 6 overlying an insulating layer 4, wherein a back gate structure 110 is present underlying the insulating layer 4, and a front gate structure 50 is present on an upper surface of the semiconductor layer 6. The first semiconductor device 121 may be present in a first device region 120 of the substrate 5, and the second semiconductor device 131 may be present in a second device region 130 of the substrate.

The first semiconductor device 121 includes a first channel dopant region 55, and second semiconductor device 131 includes a second channel dopant region 65. The first and second channel dopant regions 55, 65 are each positioned underlying the front gate structure 50 of their respective first and second semiconductor device 121, 131. Each of the first and second channel dopant regions 55, 65 may have a first concentration 57 present at an interface 56 of the semiconductor layer 6 and the insulating layer 4, and at least a second concentration 58 present at the interface 59 of the front gate structure 50 and the semiconductor layer 6 corresponding to each of the first and second semiconductor devices 121, 131, wherein the first concentration 57 is greater than the second concentration 58. Source regions 70 and drain regions 80 may also be present in the semiconductor layer 6 of the first and second device regions 120, 130 of the substrate 5. In one embodiment, each of the first semiconductor device 121 and the second semiconductor device 131 may further include halo dopant regions 30. The halo dopant regions 30 may be composed of a conductivity type dopant that is opposite the conductivity type of the source region 70 and the drain region 80.

In one embodiment, the common source and drain region 90 is shared by the first semiconductor device 121 and the second semiconductor device 131 that isolates the channel region of the first semiconductor device 121 from the channel region of the adjacent second semiconductor device 131. A dopant region 96 may be disposed below the common source and drain region 90 substantially within insulating region 4 having an opposite conductivity type than the common source and drain region 90 and does not counter dope the common source and drain region 90, thus providing improved isolation between the first channel dopant region 55 of the first semiconductor devices 121 and the second channel dopant region 65 of the second semiconductor device 131.

Figure 5:
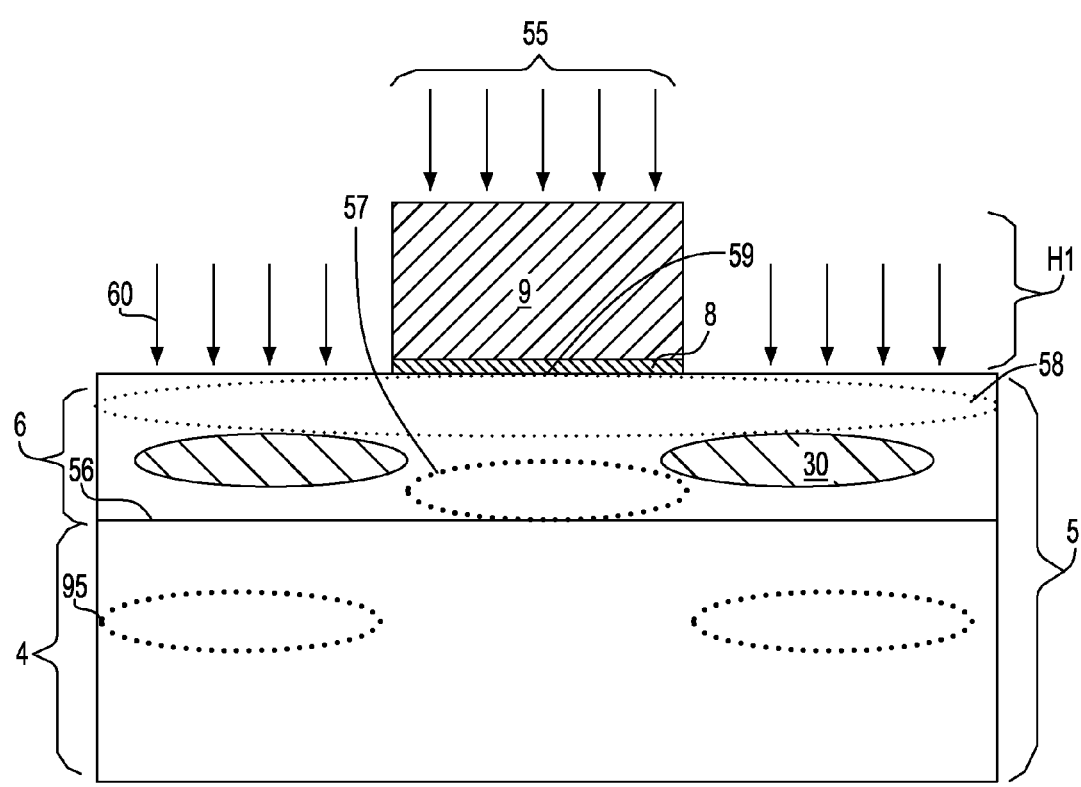
FIG. 5 is a side cross-sectional view depicting implanting a first dopant through the gate structure into the substrate, in accordance with the present invention.

The various components of the structure shown in FIGS. 1 and 2, as well as one embodiment of the process that can be used in forming the same, will now be described in greater detail referring to FIGS. 3-5. Although FIGS. 3-5 are directed to the processing of a single device, as depicted in FIG. 1, the method described below may be used to provide a multiple semiconductor devices, as depicted in FIG. 2, wherein each region of the device may optionally be selectively processed with the use of block masks, such as photoresist block masks.

FIG. 3 depicts an initial structure that may be used in the inventive method that includes a substrate 5 composed of an insulating layer 4 and a semiconductor layer 6 atop the insulating layer 4, and a gate layer stack 7 atop the substrate 5. The gate layer stack 7 includes a gate dielectric layer 8 present atop the semiconductor layer 6 of the substrate 5, a gate conductor layer 9 present atop the gate dielectric layer 8, and a dielectric cap layer 11 atop the gate conductor layer 9.

In one embodiment, the substrate 5 includes an SOI substrate. An SOI substrate includes a top semiconductor layer 6 (i.e., active semiconductor layer, which is also referred to as an SOI layer 6 or semiconductor layer 6) atop a buried insulator layer 4, which may be referred to as a buried insulating layer. In one embodiment a back gate structure 110 is present underlying the insulating layer 4. The back gate structure 110 can be electrically isolated from the semiconductor layer 6 by the insulating layer 4. The semiconductor layer 6 and back gate structure 110 may comprise one of Si, Ge alloys, SiGe, GaAs, InAs, InP, SiCGe, SiC as well as other IIIN or IINI compound semiconductors. The back gate structure 110 is typically composed of doped polysilicon, but may also be comprised of Ge, SiGe, SiGeC, metal silicides, metallic nitrides, metals (for example W, Ir, Re, Ru, Ti, Ta, Hf, Mo, Nb, Ni, Al) or other conductive materials.

In one embodiment, the insulating layer 4 separating the semiconductor layer 6 from the back gate structure 110 may be a crystalline or non-crystalline oxide or nitride. In one embodiment, the SOI substrate employed in the present invention may be formed utilizing a layer transfer process including a bonding step. In another embodiment, an implantation process, such as SIMOX (Separation by IMplantation of OXygen), can be used in forming the SOI substrate. In one embodiment, the semiconductor layer 6 has a thickness from about 3 nm to about 100 nm, and the insulating layer 4 has a thickness ranging from about 10 nm to about 150 nm.

It is noted that although an SOI substrate is depicted and described in the following discussion, embodiments of the present invention have been contemplated that utilize a bulk semiconductor substrate. In another embodiment of the present invention, in which a bulk semiconductor substrate is used, the bulk semiconductor substrate comprises one of Si, Ge alloys, SiGe, GaAs, InAs, InP, SiCGe, SiC as well as other IIIN or IINI compound semiconductors.

Still referring to FIG. 3, the gate layer stack 7 is formed on the semiconductor layer 6. The gate dielectric layer 8 may be a low-k dielectric material (having a dielectric constant equal to or less than 4.0), such as $SiO_2$, or a high-k dielectric (having a dielectric constant greater than about 4.0), such as oxides of Ta, Zr, Al or combinations thereof. Hf containing high-k dielectrics have also been contemplated and are within the scope of the present invention. The gate dielectric layer 8 typically has a thickness of from about 1 nm to about 10 nm. In one embodiment, the gate dielectric layer 8 has a thickness of from about 1.5 nm to about 2.5 nm. The gate dielectric layer 8 may be formed using a deposition method, such as chemical vapor deposition, or may be formed using a thermal growth method, such as thermal oxidation.

In one embodiment, the gate conductor layer 9 is composed of polysilicon. The gate conductor layer 9 may also be comprised of a conductor selected from the group including, but not limited to: elemental metals, metal alloys, or metal silicides. The gate conductor layer 9 may be formed using chemical vapor deposition, such as plasma enhanced chemical vapor deposition, or physical vapor deposition, such as plating or sputtering. In one embodiment, the gate conductor layer 9 has a thickness ranging from about 10 nm to about 100 nm.

The dielectric cap layer 11 can be composed of an oxide, a nitride or an oxynitride. In one embodiment, the dielectric cap layer 11 is composed of a nitride, such as silicon nitride. The dielectric cap layer 11 may be formed using chemical vapor deposition, such as plasma enhanced chemical vapor deposition, or thermal growth. In one embodiment, the dielectric cap layer 11 has a thickness of from about 10 nm to about 100 nm. It is noted that embodiments of the present invention have been contemplated in which the dielectric cap layer 11 may be omitted.

The thickness of the gate conductor layer 9 and the gate dielectric layer 8 may be selected to provide a front gate structure 50 height H1 ranging from about 40 nm to about 200 nm, as depicted in FIG. 4. Typically, the thickness of the gate conductor layer 9 and the gate dielectric layer 8 are selected to provide a front gate structure 50 height H1 ranging from about 40 nm to about 150 nm. Even more typically, the thickness of the gate conductor layer 9 and the gate dielectric layer 8 are selected to provide a front gate structure 50 height H1 ranging from about 50 nm to about 100 nm.

FIG. 4 depicts forming a front gate structure 50 from the gate layer stack that is present atop the semiconductor layer 6 of the substrate 5. The front gate structure 50 may be formed utilizing photolithography and etching. In one embodiment, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. The patterned photoresist may be utilized to etch the dielectric cap layer 11, wherein following etch of the dielectric cap layer 11, the dielectric cap layer 11 is utilized as an etch mask during etching of the gate conductor layer 9 and the gate dielectric layer 8. The dielectric cap layer 11 may be omitted. The gate layer stack may be etched using an anisotropic etch process, such as a reactive ion etch (RIE). Following etching of the gate layer stack, the photomask may be removed using a chemical stripping process or oxygen ashing. In one embodiment, in which the dielectric cap layer 11 is present, following etching of the gate conducting layer 9 and the gate dielectric layer 8, the dielectric layer 11 may be removed by an etch process, such as etching with a selective etch chemistry.

FIG. 5 depicts implanting a first dopant 60 into the substrate 5. The first dopant 60 that is implanted through the front gate structure 50 provides a channel dopant region 55, wherein the first dopant 60 is implanted into a portion of the substrate 5 underlying the front gate structure 50 and present at a depth approximately equal to the interface 56 between the semiconductor layer 6 and the insulating layer 4. The first dopant 60 that is implanted into the portion 95 of the substrate 5 that is adjacent to the portion of the substrate 5 underlying the front gate structure 50 may be present at a depth extending into the insulating layer 4.

The first dopant 60 is composed of a p-type dopant or an n-type dopant. The first dopant 60 may include boron, indium or combinations thereof. In one embodiment, boron (B) atoms are implanted through the gate conductor layer 9 and the gate dielectric layer 8 of the front gate structure 50 to provide a channel dopant region 55 underlying the portion of the semiconductor layer 6 that is underlying the front gate structure 50. The channel dopant region 55 may be a graded dopant region, wherein the dopant concentration, i.e. first dopant concentration 57, increases from the interface 56 between the semiconductor layer 6 and the insulating layer 4 to the interface 59 between the gate dielectric layer 8 and the gate conductor layer 6, i.e., second dopant concentration 58.

The conditions of the first dopant 60 process are selected to provide a peak dopant concentration of the first dopant 60 underlying the front gate structure 50 at the interface 56 of the semiconductor layer 6 and insulating layer 4 of the substrate 5, wherein the conditions of the first dopant 60 process include, but are not limited to: dopant type, ion dose, implant energy, beam current density, the thickness of the semiconductor layer 6, and the front gate structure 50 height H1.

The first dopant 60 implant may be composed of boron and may include an implant having an ion dosage of about $5 \times 10^{12}$ atoms/cm$^2$ or greater, with an ion dosage ranging from about $2 \times 10^{13}$ atoms/cm$^2$ to about $1 \times 10^{14}$ atoms/cm$^2$ being more preferred. The first dopant implant 60 may be practiced using an ion implant apparatus that operates at an implant energy ranging from about 10.0 keV to about 100.0 keV. Typically, the first dopant 60 implant is carried out using an implant energy of from about 20.0 keV to about 60.0 keV. This first dopant 60 implant is typically carried out at a temperature ranging from about −150° C. to about 400° C. In another example, the first dopant 60 implant is carried out with a temperature ranging from about −100° C. to about 200° C.

By implanting a first dopant 60, such as boron, into the semiconductor layer 6 at the interface 56 of the semiconductor layer 6 and the insulating layer 4, the present invention provides enhanced punch-through immunity. In one embodiment, the first dopant 60 contributes to the manufacture of semiconducting devices having more consistent threshold voltage values. The first dopant 60 present at the interface 56 of the semiconductor layer 6 and the insulating layer 4 may also provide for a reduced back channel leakage. The first dopant 60 is also present in portion 95 of the substrate 5 adjacent to the portion of the substrate 5 underlying the front gate structure 50 that is present at a depth extending into the insulating layer 4.

Referring to FIG. 1, in a following process step, a halo implant 30 is conducted with an angled ion implantation into the portion of the semiconductor layer 6 of the substrate 5, in which the channel edge region and bottom of the source region 70 and drain region 80 is present.

Typically, the halo implant 30 is of the same conductivity type as the first dopant 60. In one embodiment, the halo implant 30 is composed of a p-type dopant. In another embodiment, the halo implant 30 is composed of an n-type dopant. The halo implant 30 may be composed of boron atoms. Other examples of halo implants include indium. The halo implant 30 may include an ion implantation process having an ion dosage of about $5 \times 10^{12}$ atoms/cm$^2$ or greater, at an energy from about 5.0 keV to about 60.0 keV, wherein the ion implantation process is angled by a value ranging from 10° to about 50°, as measured from a plane normal to the surface of the substrate 5.

In a next processing step, the present invention may include the formation of a first dielectric spacer 45a adjacent the sidewalls of the front gate structure 50. In one embodiment, first the dielectric spacer 45a may be composed of an oxide, nitride or oxynitride material. A first dielectric spacer 45a, such as an oxide spacer is formed in direct contact with the sidewalls of the gate conductor 9. In one embodiment, in which the first dielectric spacer 45a is composed of an oxide, the first dielectric spacer 45a may be formed using a conformal deposition process, and may have a thickness ranging from about 1 nm to about 5 nm.

Following the formation of the first dielectric spacer 45a, extension regions 24 are then formed using an ion implantation process. The extension regions 24 may be formed having a dopant conductivity type that is opposite the conductivity type as the first dopant 60, i.e., channel region dopant 55. The extension regions 24 may be composed of a p-type dopant. P-type extension regions are typically produced with group III-A elements. The extension regions 24 may also be composed of an n-type dopant. N-type extension regions are typically produced with group V elements. In the case of the p-type implants, a typical impurity species is boron or BF$_2$. Boron with an energy of about 0.2 keV to 3.0 keV or BF$_2$ with an energy of about 1.0 keV to about 15.0 keV and a dose of about $5 \times 10^{13}$ atoms/cm$^2$ to about $3 \times 10^{16}$ atoms/cm$^2$ can be used to implant the p-type region. A typical implant for the n-type regions is arsenic. The n-type regions can be implanted with arsenic using an energy of about 0.5 keV to about 5.0 keV with a dose of about $3 \times 10^{13}$ atoms/cm$^2$ to about $3 \times 10^{16}$ atoms/cm$^2$.

Following extension region implant, a source and drain spacer 45b is formed by depositing a conformal film like SiN for example and next removing the SiN from the horizontal surfaces using a highly directional dry etch process. The source and drain spacer 45b may have a width ranging from about 2 nm to about 30 nm.

Following the formation of the source and drain spacer 45b, source regions 80 and drain regions 90 are then formed using an ion implantation process. The source regions 80 and drain regions 90 may be formed having a dopant conductivity type that is opposite the conductivity type as the first dopant 60, i.e., channel dopant, and the same conductivity as the extension regions 24. The source region 80 and drain region 90 may be composed of a p-type dopant. P-type source regions 80 and drain region 90 are typically produced with group III-A elements. The source region 80 and drain region 90 may also be composed of an n-type dopant. N-type source region 80 and drain regions 90 are typically produced with group V elements. In the case of the p-type implants, a typical impurity species is boron or BF$_2$. Boron with an energy of about 1 keV to 10 keV or BF$_2$ with an energy of about 5 keV to about 50 keV and a dose of about $5 \times 10^{14}$ atoms/cm$^2$ to about $5 \times 10^{15}$ atoms/cm$^2$ can be used to implant the p-type region. A typical implant for the n-type regions is arsenic. The n-type regions can be implanted with arsenic using an energy of about 10 keV to 50 keV with a dose of about $5 \times 10^{14}$ atoms/cm$^2$ to about $5 \times 10^{15}$ atoms/cm$^2$. Following the formation of the source region 80 and the drain region 90, the dopant region 95 of the first dopant 60 in the insulating layer 4 is positioned underlying the source region 80 and the drain region 90.

Normal BEOL processing may now be performed such as standard contact and wiring processes well known within the skill of the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed:

1. A method of forming a semiconductor device comprising:
providing a substrate including a semiconductor layer overlying an insulating layer, wherein a back gate structure is present underlying the insulating layer;
forming a front gate structure overlying the semiconductor layer of the substrate; and
implanting a first dopant through the front gate structure into the substrate, wherein the first dopant implanted into a portion of the substrate underlying the front gate structure is present at a depth approximately equal to an interface between the semiconductor layer and the insulating layer and the first dopant implanted into a portion of the substrate adjacent to the portion of the substrate underlying the front gate structure is present at a depth extending into the insulating layer.

2. The method of claim 1, wherein the substrate is a silicon on insulator substrate.

3. The method of claim 1, wherein forming the gate structure includes the steps of depositing a gate dielectric layer atop the semiconductor layer; depositing a gate conductor layer atop the gate dielectric layer; forming a photoresist mask atop the gate conductor layer; and etching using the photoresist mask as an etch mask.

4. The method of claim 3, further comprising implanting extension regions.

5. The method of claim 4, wherein the extension regions are composed of a second dopant having an opposite conductivity than the first dopant.

6. The method of claim 5, further comprising a halo implant.

7. The method of claim 6, wherein the halo implant is comprised of a dopant having a same conductivity type as the first dopant.

8. The method of claim 7, wherein the first dopant is a p-type dopant and the second dopant is an n-type dopant, or the first dopant is an n-type dopant and the second dopant is a p-type dopant.

9. The method of claim 8, further comprising removing the resist mask.

* * * * *